United States Patent [19]

Hoffmeister et al.

[11] Patent Number: 5,134,339
[45] Date of Patent: Jul. 28, 1992

[54] HIGH-VOLTAGE LEAD-THROUGH FOR PARTICLE-BEAM APPARATUS

[75] Inventors: Dietrich Hoffmeister, Oberkochen; Johannes Bihr, Aalen; Harald Niebel, Oberkochen, all of Fed. Rep. of Germany

[73] Assignee: Carl-Zeiss-Stiftung, Heidenheim, Fed. Rep. of Germany

[21] Appl. No.: 704,175

[22] Filed: May 22, 1991

[30] Foreign Application Priority Data

May 23, 1990 [DE] Fed. Rep. of Germany ....... 4016556

[51] Int. Cl.⁵ ............................................ H01J 19/44
[52] U.S. Cl. ..................................... 313/452; 313/456; 313/250; 313/247; 313/257; 313/268
[58] Field of Search ............... 313/452, 447, 250, 456, 313/247, 257, 268

[56] References Cited

U.S. PATENT DOCUMENTS 2,305,458 12/1942 Ruska et al. ......................... 313/456

FOREIGN PATENT DOCUMENTS 55468 5/1977 Japan .................................... 313/257

Primary Examiner—Palmer C. DeMeo
Attorney, Agent, or Firm—Walter Ottesen

[57] ABSTRACT

The invention is directed to a high-voltage lead-through arrangement for introducing a high voltage into an enclosure wherein a vacuum is maintained such as for particle-beam apparatus. The arrangement includes: a high-voltage electrode for carrying a high potential; an insulator enclosing the high-voltage electrode and having a surface defining a boundary with the vacuum; and, an outer low-voltage electrode surrounding the insulator for carrying a low potential. The electrodes are spaced from each other by an electrode spacing measured along the surface of the insulator. The high-voltage electrode and the insulator conjointly define a first region wherein the high potential is present to a good approximation; and the first region is bounded by the insulator surface for a first distance of up to approximately 1/10 of the electrode spacing. The low-voltage electrode and the insulator conjointly define a second region wherein the low potential is present to a good approximation and the second region is bounded by the insulator surface for a second distance of up to approximately 1/10 of the electrode spacing. With this arrangement, the high-voltage lead-through can be operated at a higher voltage than the known configurations without the occurrence of micro-discharges.

11 Claims, 4 Drawing Sheets

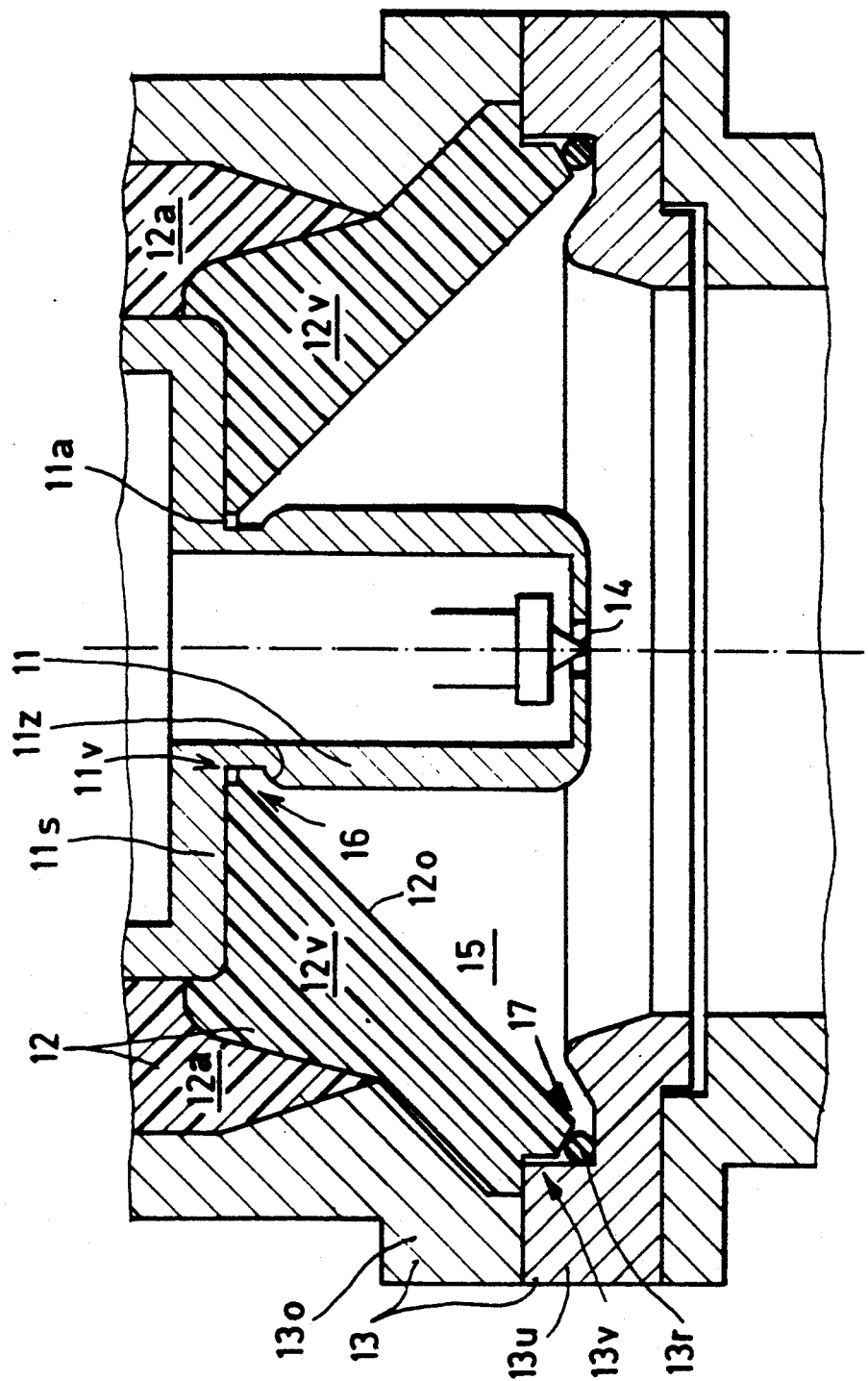

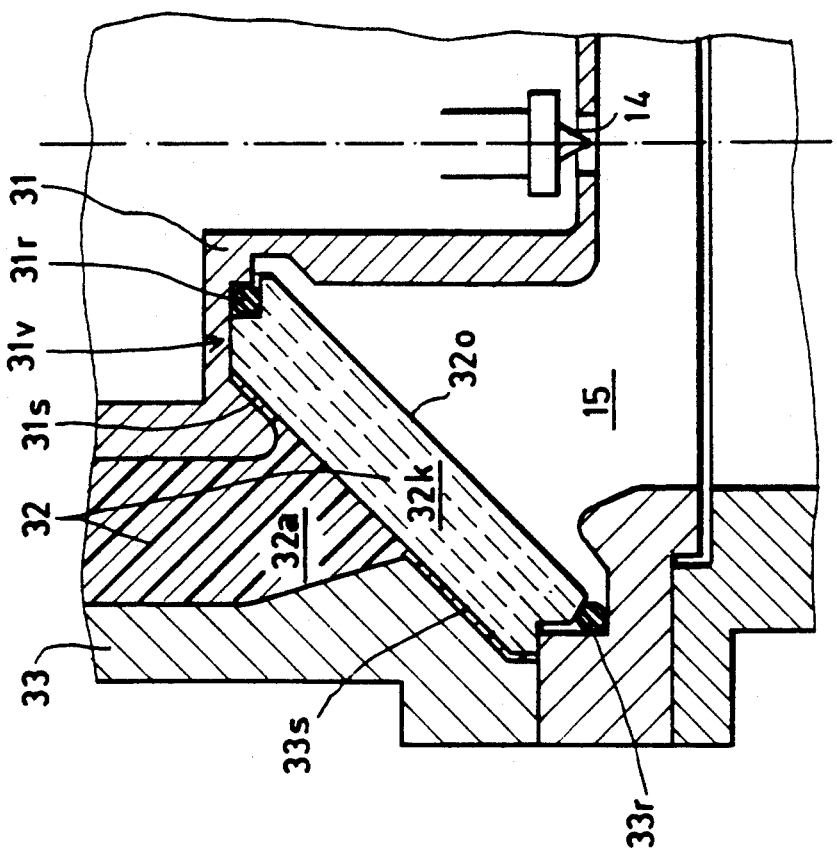
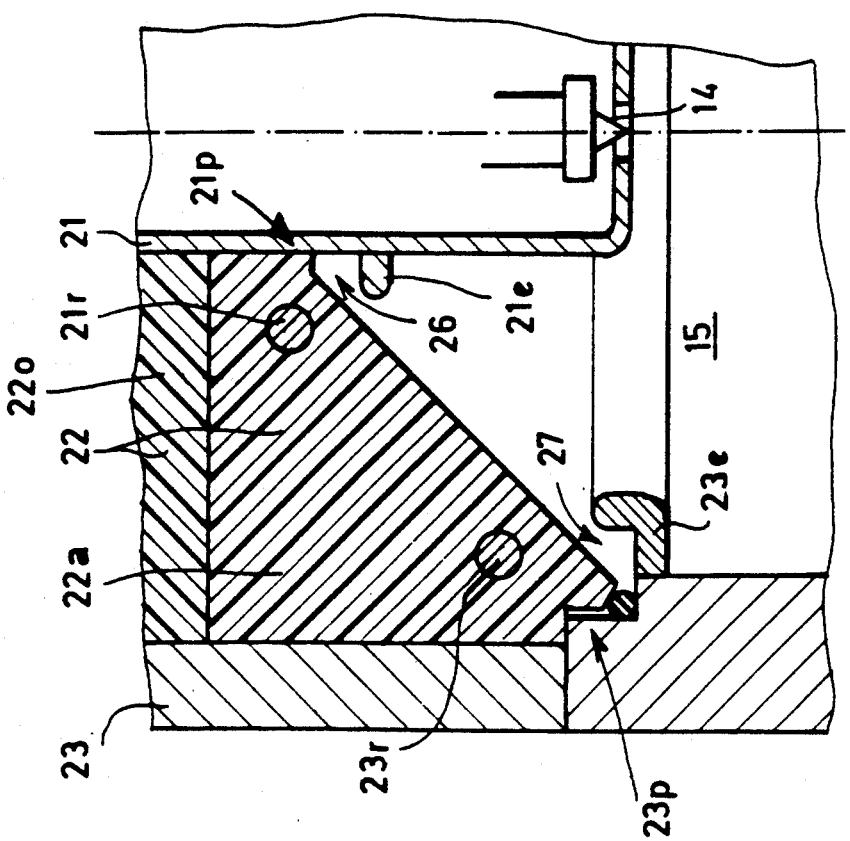

HIGH-VOLTAGE LEAD-THROUGH FOR PARTICLE-BEAM APPARATUS

1. Field of the Invention

The invention relates to a high-voltage lead-through for introducing high voltage into a vacuum and especially for particle-beam apparatus including a high-voltage electrode, an insulator surrounding the high-voltage electrode with the insulator having a surface defining a boundary with the vacuum; and, an outer electrode which surrounds the insulator and is at a lower potential.

2. Background of the Invention

Particle-beam apparatus include electron microscopes, ion microscopes and electron-beam apparatus. In electron microscopes and electron-beam apparatus, the cathode has a high negative potential which must be adequately well insulated with respect to the housing which is at ground potential. Substantial significance is attached to the configuration of the high-voltage lead-through with respect to the insulator because of the large potential difference.

U.S. Pat. No. 4,396,861 discloses a high-voltage lead-through wherein the insulator surface defines a boundary with the vacuum and starts at the beginning of a step-wise enlargement of the high-voltage electrode and defines an angle with this electrode which is approximately half as large as the angle between the portions of the high-voltage electrode defining the step-wise enlargement at the start of the step-wise enlargement. In this way, a more favorable potential distribution on the insulator surface defining a boundary with the vacuum is obtained thereby preventing the formation of so-called micro-discharges on the insulator surface.

The improvement obtained in this manner no longer fulfills to an adequate extent the further increased requirements imposed on high-voltage electron microscopes especially for the larger high voltages utilized today for obtaining higher resolution. The increased requirements can only be fulfilled by greater spacings and thereby with greater housing dimensions. However, this would too greatly increase complexity and the space requirement.

SUMMARY OF THE INVENTION

In view of the foregoing, it is an object of the invention to improve the known high-voltage lead-through so that it is also suitable for higher voltages without the necessity of increasing the spatial dimension of the lead-through.

The high-voltage lead-through arrangement of the invention is for introducing a high voltage into an enclosure wherein a vacuum is maintained such as for particle-beam apparatus. The arrangement includes: a high-voltage electrode for carrying a high potential; an insulator enclosing the high-voltage electrode and having a surface defining a boundary with the vacuum; an outer low-voltage electrode surrounding the insulator for carrying a low potential; the electrodes being spaced from each other by a predetermined electrode spacing measured along the surface; the high-voltage electrode and the insulator conjointly defining a first region wherein the high potential is present to a good approximation; the first region being bounded by the surface for a first distance of up to approximately 1/10 of the electrode spacing measured from the high-voltage electrode and along the surface; the low-voltage electrode and the insulator conjointly defining a second region wherein the low potential is present to a good approximation; and, the second region being bounded by the surface for a second distance of up to approximately 1/10 of the electrode spacing measured from the low-voltage electrode and along the surface.

The regions, within which the insulator surface defining a boundary of the vacuum has a spacing from an electrode up to approximately a half centimeter, can be characterized as triple regions because the vacuum, insulator and electrode lie very close to each other. The solution afforded by the invention is therefore seen in that a form is imparted to both electrodes that causes the triple regions to lie in areas which still have the same potential as the electrodes to a good approximation. In this way, the electric field strength is minimal in these regions so that no micro-discharges can form at these critical locations of the insulator surface. The field intensity variation on the insulator surface can be numerically computed pursuant to Liebmann's method which is described in the text of P. W. Hawkes entitled "Magnetic Electron Lenses", pages 64 and 65, Springer-Verlag, New York (1982).

In a further embodiment of the invention, the electrodes have recesses wherein the triple regions lie.

In another embodiment, the electrodes have raised portions between which the triple regions are located.

In still another embodiment of the invention, the triple regions lie between conductive parts such as rings which surround the electrodes with a spacing of up to approximately 2 centimeters and with which the electrodes are electrically connected.

In a preferred embodiment of the invention, the insulator part defining a boundary with the vacuum is made of a filled cast resin and the other part is made of a flexible heat-conductive silicon cast mass.

In a further embodiment, the part of the insulator facing toward the vacuum is a ceramic part.

It is preferable to assemble the outer electrode from at least two parts for manufacturing reasons.

BRIEF DESCRIPTION OF THE DRAWINGS

The invention will now be described with reference to the drawings wherein:

FIG. 1 is a cutaway view of the cathode head of an electron microscope and illustrates an embodiment of the high-voltage lead-through according to the invention;

FIG. 2 shows an embodiment of the invention wherein the electrodes are provided with upwardly projecting parts and conductive portions are placed ahead of the electrodes;

FIG. 3 is an embodiment of the invention wherein the insulator part facing toward the vacuum is made of ceramic; and, FIG. 4 is an embodiment wherein the ceramic part of the insulator is connected via metallic connections to the electrodes in a vacuum-tight manner.

DESCRIPTION OF THE PREFERRED EMBODIMENTS OF THE INVENTION

Figure 1A:
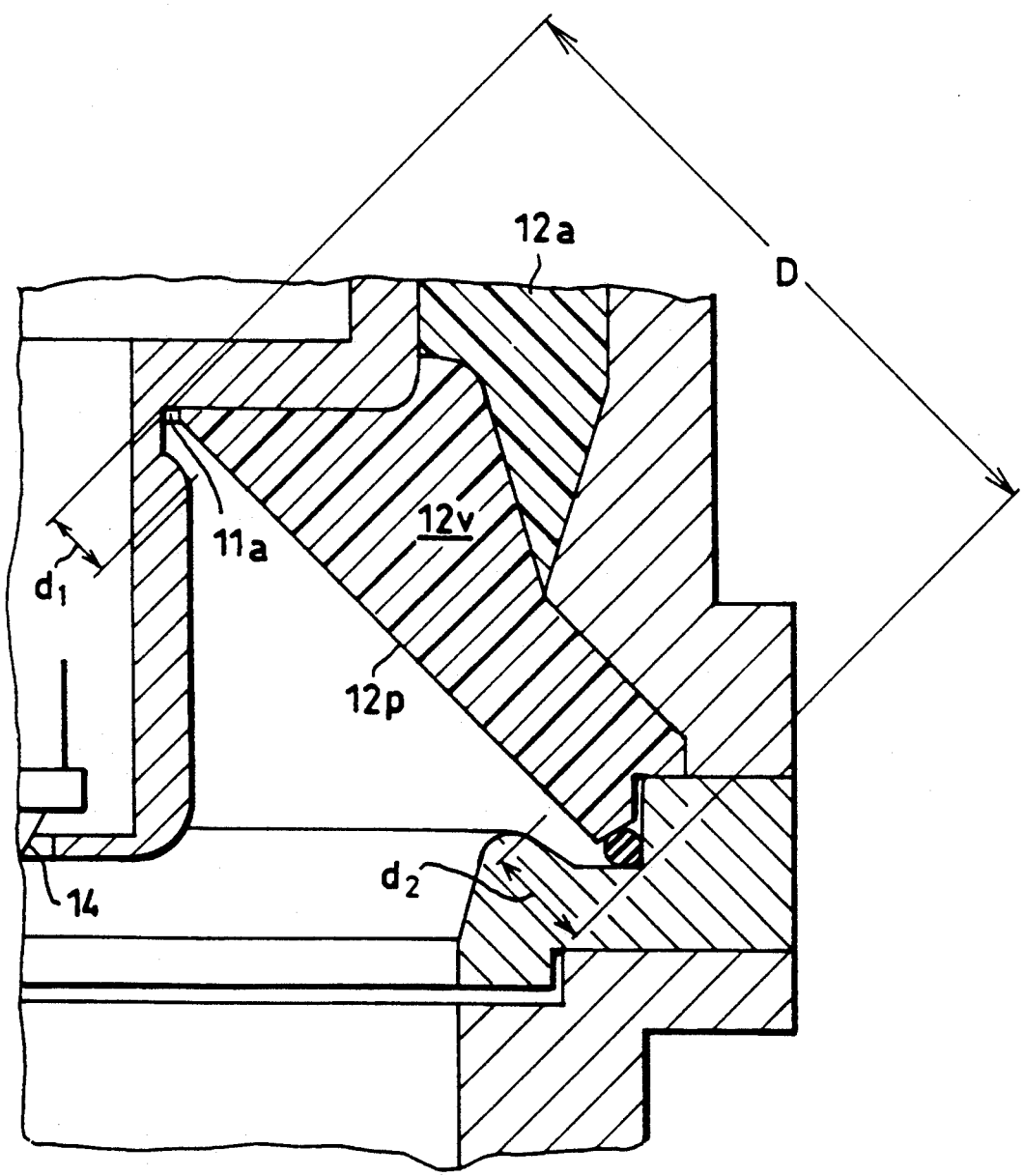
FIG. 1a is a detail enlarged view of a portion of the cathode head of FIG. 1 and shows dimensions measured along the surface of the insulator which are pertinent to the triple regions.

Referring to FIG. 1, reference numeral 11 identifies a high-voltage electrode which is also known as a Wehnelt electrode. The high-voltage electrode 11 is separated from the outer electrode 13 by the insulator 12. The outer electrode 13 is at a potential lower than the high-voltage electrode and is preferably at ground potential. Reference numeral 14 identifies the schematically drawn cathode of an electron-beam generating system which is at approximately the same potential as the high-voltage electrode 11.

The high-voltage electrode 11 includes the step-wise enlargement 11s described in U.S. Pat. No. 4,396,861 incorporated herein by reference. The surface 12p of insulator 12 defines a boundary with respect to the vacuum 15 and begins approximately at the start 11a of the step-wise enlargement 11s. The surface 12p does not have an acute angle end at 11a because of manufacturing reasons. In contrast to the high-voltage lead-through disclosed in U.S. Pat. No. 4,396,861, the high-voltage electrode 11 has a second step-wise enlargement 11z which has a surface which extends preferably parallel to the surface 12p of the insulator. However, this must not be the case since what is decisive is that a recess 11v is provided on the outer surface of the high-voltage electrode 11 wherein the insulating surface 12p terminates at the electrode.

The difference disclosed herein when compared to the high-voltage lead-through of U.S. Pat. No. 4,396,861 may appear to be slight; however, it has a very substantial effect, namely by providing a recess in the step, the potential of the electrode exists in the region 16 to a good approximation. In the region 16, the surface 12p of the insulator 12, which defines a boundary with the vacuum 15, has a spacing from the electrode 11 up to approximately one tenth of the electrode spacing in the direction of the surface 12p. The region 16 can be described as a triple region 16 because in this region, the insulator, the electrode and vacuum lie very close to each other and it is therefore especially critical with respect to the formation of micro-discharges. In this region 16, the formation of the micro-discharges is prevented up to a very considerably higher high voltage than with a simple step.

The potential of the electrode 11 is still present to a good approximation in the region 16 which is bounded by the surface 12p to a distance d1 measured along this surface as shown in FIG. 1a. The distance d1 extends by an amount up to approximately 1/10 of the electrode spacing D also measured along this surface.

The improvement achieved at the high-voltage electrode 11 must be supplemented with appropriate measures at the outer electrode 13 so that the high-voltage lead-through overall obtains better characteristics. For this purpose, and as shown in FIG. 1, the outer electrode 13 is likewise configured to have a recess 13v into which the surface 12p of the insulator 12 extends so that the triple region 17 disposed at the outer electrode likewise lies in an area wherein the potential of the outer electrode 13 is present to a good approximation. The triple region 17 is bounded by the surface 12p to a distance d2 measured along this surface as FIG. 1a. The distance d2 likewise extends by an amount up to approximately 1/10 of the electrode spacing D also measured along this surface.

For reasons of manufacture, the outer electrode 13 comprises several parts (13p, 13u) having dimensions as in the outer regions of the insulator 12 which takes account of the condition that these parts are subjected to the full atmospheric pressure.

The lower portion 12v of the insulator 12 faces toward the vacuum and is made of filled cast resin so that an adequate strength is obtained. For the upper part 12a, a flexible heat-conductive cast mass such as silicon is utilized. The upper part 12a has an intimate contact with the following: the lower part 12v, the high-voltage cable (not shown), the housing and the connecting parts. The dielectric strength of the lower part 12v is achieved by means of this intimate connection. The high-voltage cable itself is ring-shaped and cast in place above the step-wise enlargement 11s with the same diameter as the step-wise enlargement. In this way, the high-voltage cable provides a clear potential lead-through.

The heat from the heated cathode is conducted away from the insulator 12 by the heat-conductivity of the upper part 12a. Mechanical stresses occurring because of different coefficients of heat expansion are held low because of the elasticity of the upper part 12a. The sealing ring 13r provides a vacuum seal between the insulator part 12v and the outer electrode 13 assembled from the parts 13p and 13u.

FIG. 2 shows a further embodiment of the invention wherein an insulator 22 is utilized which likewise comprises two parts (22p, 22u). The potential of the electrodes (21, 23) is maintained to a good approximation in the areas (21p, 23p). The triple regions (26, 27) are arranged in the areas (21p, 23p) and are obtained in that the electrodes (21, 23) have raised portions (21e, 23e), respectively and/or that the conductive parts such as rings (21r, 23r) surround the electrodes (21, 23) in a distance of up to 2 cm and are electrically connected to these electrodes.

It is also possible to arrange rings in the vacuum 15 and/or raised portions in the insulator 22. Likewise, it is possible to use additional rings with intermediate potentials to obtain a specific potential variation on the surface of the insulator.

FIG. 3 shows an embodiment wherein the part of the insulator 32 defining a boundary with the vacuum 15 is made of a ceramic part 32k having a surface 32p which, in turn, has good vacuum characteristics. The upper part 32a of the insulator 32 is again made of a flexible heat-conductive cast mass which also fills out the gaps (31s, 33s) between the ceramic part and the electrodes (31, 33). The sealing rings (31r and 33r) provide a trouble-free vacuum seal. This embodiment also shows that the recess in the high-voltage electrode 31 can also be configured as a distinct recess 31v.

Figure 4:
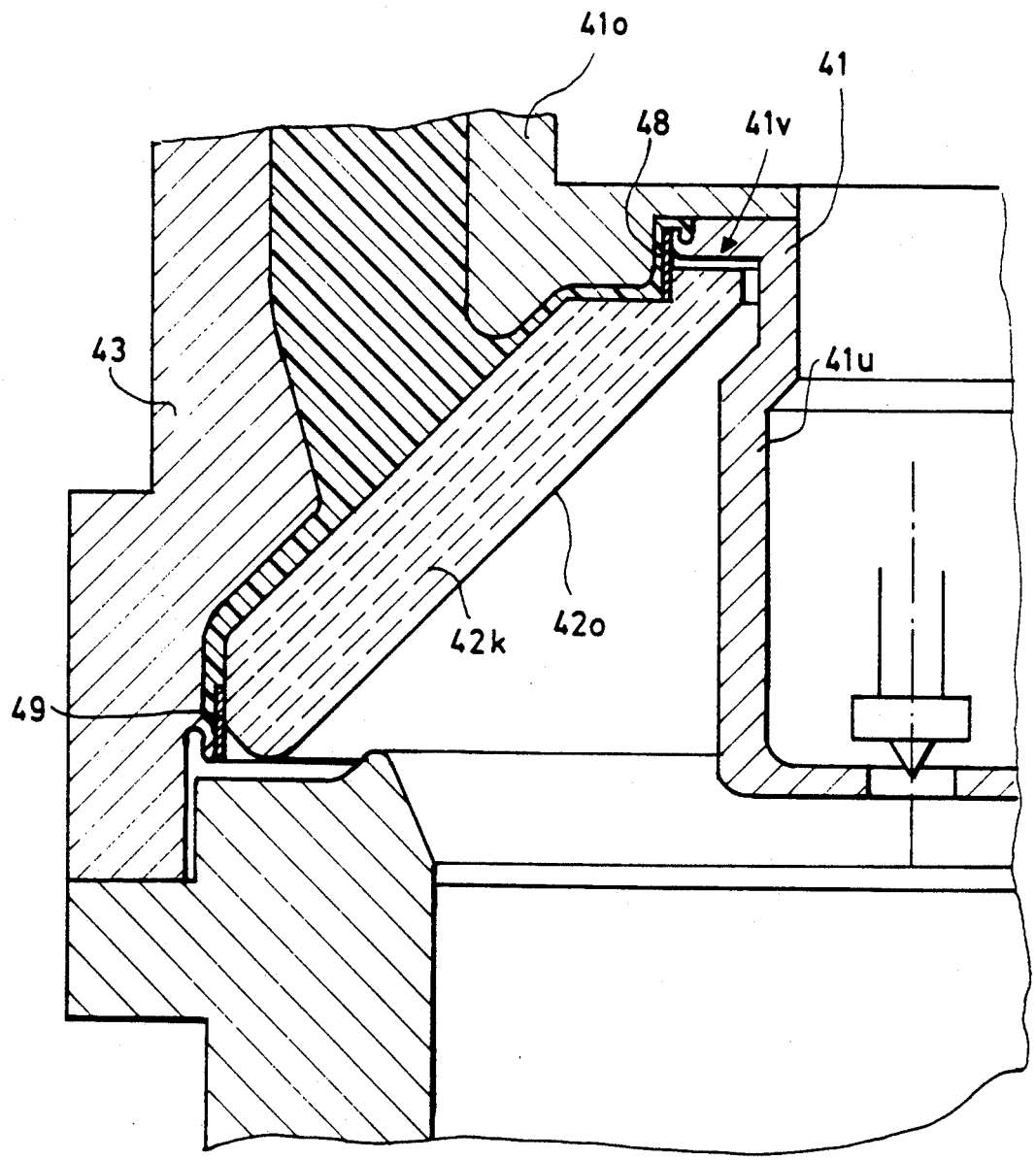

In FIG. 4, the vacuum seal between the ceramic part 42k and the electrodes (41, 43) is achieved by the metal tube pieces (48, 49) which, as is known, can be hard soldered to the ceramic part and thereafter be welded to the electrodes (41, 43). After welding, the upper part 41p of the high-voltage electrode is threadably engaged with the lower part 41u and these parts together conjointly define the recess 41v wherein the same potential is present as on the overall electrode to a good approximation and into which the surface 42p of the ceramic part 42k extends.

It is conventional to configure the high-voltage electrode, insulator and outer electrode to be essentially rotationally symmetrical because this is advantageous for manufacture. However, this is not necessary. The characteristics described can be obtained also with oval or polygonal embodiments.

It is understood that the foregoing description is that of the preferred embodiments of the invention and that various changes and modifications may be made thereto without departing from the spirit and scope of the invention as defined in the appended claims.

What is claimed is:

1. A high-voltage lead-through arrangement for introducing a high voltage into an enclosure wherein a vacuum is maintained such as for particle-beam apparatus, the arrangement comprising:

a high-voltage electrode for carrying a high potential;

an insulator enclosing said high-voltage electrode and having a surface defining a boundary with the vacuum;

an outer low-voltage electrode surrounding said insulator for carrying a low potential;

said electrodes being spaced from each other by a predetermined electrode spacing measured along said surface;

said high-voltage electrode and said insulator conjointly defining a first region wherein said high potential is present to a good approximation;

said first region being bounded by said surface for a first distance of up to approximately 1/10 of said electrode spacing measured from said high-voltage electrode and along said surface;

said low-voltage electrode and said insulator conjointly defining a second region wherein said low potential is present to a good approximation; and, said second region being bounded by said surface for a second distance of up to approximately 1/10 of said electrode spacing measured from said low-voltage electrode and along said surface.

2. The high-voltage lead-through arrangement of claim 1, said high-voltage and low-voltage electrodes having first and second recesses formed therein to define said first and second regions, respectively.

3. The high-voltage lead-through arrangement of claim 1, said high-voltage and low-voltage electrodes having first and second projections formed thereon to define said first and second regions, respectively.

4. The high-voltage lead-through arrangement of claim 1, a first conductive part being mounted so as to be spaced up to 2 cm from said high-voltage electrode and being electrically connected to said high-voltage electrode; and, a second conductive part being mounted so as to be spaced up to 2 cm from said low-voltage electrode and being electrically connected to said low-voltage electrode.

5. The high-voltage lead-through arrangement of claim 1, said insulator being made of a first part defining said surface facing the vacuum and a second part; said first part being made of a filled cast resin; and, said second part being made of a flexible, heat-conductive silicon cast mass.

6. The high-voltage lead-through arrangement of claim 1, said insulator being made of a first part defining said surface facing the vacuum and a second part; said first part being made of ceramic; and, said second part being made of a flexible heat-conductive silicon cast mass.

7. The high-voltage lead-through arrangement of claim 1, said low-voltage electrode being assembled from a plurality of parts.

8. The high-voltage lead-through arrangement of claim 1, said high-voltage electrode being assembled from a plurality of parts.

9. The high-voltage lead-through arrangement of claim 1, further comprising a sealing ring interposed between said insulator and said low-voltage electrode.

10. The high-voltage lead-through arrangement of claim 6, said arrangement further comprising first and second tubular pieces made of metal, said first part being solder connected to said high-voltage electrode via said first tubular piece in a vacuum-tight manner by means of a solder connection; and, said first part being solder connected to said low-voltage electrode via said second tubular piece in a vacuum-tight manner by means of a solder connection.

11. The high-voltage lead-through arrangement of claim 6, said arrangement further comprising first and second tubular pieces made of metal, said first part being weld connected to said high-voltage electrode via said first tubular piece in a vacuum-tight manner by means of a weld connection; and, said first part being weld connected to said low-voltage electrode via said second tubular piece in a vacuum-tight manner by means of a weld connection.

* * * * *